(12) United States Patent
Choi et al.

(10) Patent No.: US 9,449,815 B2
(45) Date of Patent: Sep. 20, 2016

(54) METHOD OF GROWING GALLIUM NITRIDE BASED SEMICONDUCTOR LAYERS AND METHOD OF FABRICATING LIGHT EMITTING DEVICE THEREWITH

(71) Applicant: SEOUL VIOSYS CO., LTD., Ansan-si (KR)

(72) Inventors: Seung Kyu Choi, Ansan-si (KR); Woo Chul Kwak, Ansan-si (KR); Chae Hon Kim, Ansan-si (KR); Jung Whan Jung, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 148 days.

(21) Appl. No.: 14/056,664

(22) Filed: Oct. 17, 2013

(65) Prior Publication Data

US 2014/0162437 A1 Jun. 12, 2014

(30) Foreign Application Priority Data

Dec. 10, 2012 (KR) ........................ 10-2012-0142550

(51) Int. Cl.
*H01L 21/02* (2006.01)

(52) U.S. Cl.
CPC ..... *H01L 21/02458* (2013.01); *H01L 21/0254* (2013.01); *H01L 21/0262* (2013.01); *H01L 21/02507* (2013.01)

(58) Field of Classification Search
CPC .................. H01L 21/02458; H01L 21/0262; H01L 21/02507; H01L 21/0254
See application file for complete search history.

(56) References Cited

U.S. PATENT DOCUMENTS

| | | | |
|---|---|---|---|
| 2006/0246612 A1* | 11/2006 | Emerson et al. | 438/22 |
| 2007/0111488 A1* | 5/2007 | Chakraborty et al. | 438/478 |
| 2008/0048172 A1* | 2/2008 | Muraki | H01L 33/38 257/13 |
| 2009/0127510 A1* | 5/2009 | Isobe | C09D 11/50 252/301.36 |
| 2010/0035410 A1* | 2/2010 | Sonobe et al. | 438/478 |
| 2011/0168974 A1* | 7/2011 | Okuno | 257/13 |
| 2012/0037881 A1* | 2/2012 | Kim | H01L 33/007 257/13 |

* cited by examiner

*Primary Examiner* — Minh-Loan Tran
*Assistant Examiner* — Farid Khan
(74) *Attorney, Agent, or Firm* — H.C. Park & Associates, PLC

(57) ABSTRACT

Exemplary embodiments of the present invention relate to a method of growing gallium nitride-based semiconductor layers through metal-organic chemical vapor deposition, including disposing a substrate in a chamber, growing a first conductivity-type gallium nitride-based semiconductor layer on the substrate at a first chamber pressure, growing a gallium nitride-based active layer on the first conductivity-type gallium nitride-based semiconductor layer at a second chamber pressure higher than the first chamber pressure, and growing a second conductivity-type gallium nitride-based semiconductor layer on the active layer at a third chamber pressure lower than the second chamber pressure.

10 Claims, 2 Drawing Sheets

METHOD OF GROWING GALLIUM NITRIDE BASED SEMICONDUCTOR LAYERS AND METHOD OF FABRICATING LIGHT EMITTING DEVICE THEREWITH

CROSS-REFERENCE TO RELATED APPLICATION

This application claims priority from and the benefit of Korean Patent Application No. 10-2012-0142550, filed on Dec. 10, 2012, which is hereby incorporated by reference for all purposes as if fully set forth herein.

BACKGROUND

1. Field

Exemplary embodiments of the present invention relate to a method of growing gallium nitride-based semiconductor layers and a method of fabricating a light emitting device, and more particularly, to a method of growing gallium nitride-based semiconductor layers and a method of fabricating a light emitting device using metal-organic chemical vapor deposition.

2. Discussion of the Background

Generally, group-III nitrides such as gallium nitrides (GaN) have excellent thermal stability and a direct transition type energy band structure. Accordingly, gallium nitride compound semiconductors have been broadly studied for application to light emitting devices, such as light emitting diodes or laser diodes, which emit visible and ultraviolet light. In particular, blue and green light emitting diodes using indium gallium nitride (InGaN) have been used in a wide range of fields, such as large natural color flat display devices, signal lights, indoor lighting, high density light sources, high resolution output systems, optical communication, and the like.

In the manufacture of semiconductor devices, gallium nitride compound semiconductor layers are generally grown on a substrate through metal-organic chemical vapor deposition (MOCVD). An apparatus for MOCVD includes a chamber for loading a substrate, and source gas and atmosphere gas (including carrier gas) are supplied to grow an epitaxial layer on the substrate under a predetermined chamber pressure.

Commercially obtained MOCVD apparatuses may be generally configured to grow epitaxial layers at low pressures of about 200 Torr or less. Such a low pressure MOCVD apparatus can achieve relatively rapid growth of the epitaxial layer, but may create a high density of crystal defects, particularly point defects, in the epitaxial layer. As a result, the epitaxial layer may have low crystal quality.

Moreover, when the low pressure MOCVD apparatus is used to grow well layers in an active layer, growth temperature may be lowered to, for example, about 750° C. in order to increase the content of In in the well layers.

Further, when a barrier layer is grown on the well layer at the low growth temperature of the well layer, it may be difficult for the barrier layer to have good crystal quality. Thus, a method of growing a barrier layer by raising the growth temperature after growth of a well layer has been adopted. For an active layer including a plurality of well layers and a plurality of barrier layers, the temperature of the substrate within the chamber requires frequent variation, thereby increasing a processing time for growth of the active layer. Furthermore, when the substrate temperature is raised after growth of the well layer, the well layer may decompose, thereby causing deterioration in crystal quality of the well layer near an interface between the well layer and the barrier layer. To solve such a problem, a cap layer may be formed before growth of the barrier layer, but the cap layer may still fail to provide desirable interface characteristics between the well layer and the barrier layer.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention provide a method of growing semiconductor layers and a method of fabricating a light emitting device, which can improve interface characteristics in a semiconductor stack including gallium nitride layers having different compositions, such as in an active layer.

Exemplary embodiments of the present invention also provide a method of growing semiconductor layers and a method of fabricating a light emitting device, which can reduce a processing time for growth of semiconductor layers.

Additional features of the invention will be set forth in the description which follows, and in part will be apparent from the description, or may be learned by practice of the invention.

An exemplary embodiment of the present invention discloses a method of growing gallium nitride-based semiconductor layers through metal-organic chemical vapor deposition. The method includes disposing a substrate in a chamber; growing a first conductivity-type gallium nitride-based semiconductor layer on the substrate at a first chamber pressure; growing a gallium nitride-based active layer on the first conductivity-type gallium nitride-based semiconductor layer at a second chamber pressure higher than the first chamber pressure; and growing a second conductivity-type gallium nitride-based semiconductor layer on the active layer at a third chamber pressure lower than the second chamber pressure. The first, second, and third chamber pressures are lower than 760 Torr.

An exemplary embodiment of the present invention also discloses a method of fabricating a semiconductor device by growing gallium nitride-based semiconductor layers through metal-organic chemical vapor deposition. The method includes disposing a substrate in a chamber; growing a first conductivity-type gallium nitride-based semiconductor layer on the substrate at a first chamber pressure; growing a gallium nitride-based active layer on the first conductivity-type gallium nitride-based semiconductor layer at a second chamber pressure higher than the first chamber pressure; and growing a second conductivity-type gallium nitride-based semiconductor layer on the active layer at a third chamber pressure lower than the second chamber pressure. The first, second, and third chamber pressures are lower than 760 Torr.

An exemplary embodiment of the present invention also discloses a method of growing gallium nitride-based semiconductor layers through metal-organic chemical vapor deposition. The method includes disposing a substrate in a chamber; growing a first conductivity-type GaN layer on the substrate at a chamber pressure in the range of 100 Torr to 300 Torr; growing a gallium nitride-based active layer on the first conductivity-type GaN layer at a chamber pressure in the range of 300 Torr to 700 Torr; and growing a second conductive type GaN layer on the active layer at a chamber pressure in the range of 100 Torr to 300 Torr. The active layer includes well layers and barrier layers.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of the present invention will become apparent from the detailed description of the following embodiments in conjunction with the accompanying drawings.

DETAILED DESCRIPTION OF THE ILLUSTRATED EMBODIMENTS

Figure 1:
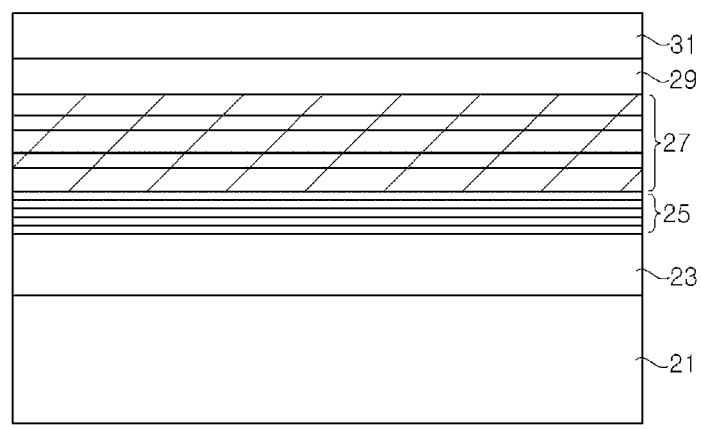
FIG. 1 is a schematic sectional view of a semiconductor device in accordance with one embodiment of the present invention.

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, like components will be denoted by like reference numerals throughout the specification, and the widths, lengths, and thicknesses of certain elements, layers or features may be exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
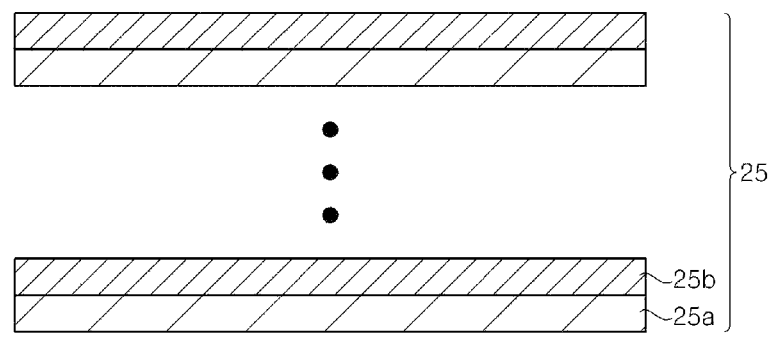
FIG. 2 is an enlarged sectional view of an active layer in accordance with one embodiment of the present invention.
Figure 3:
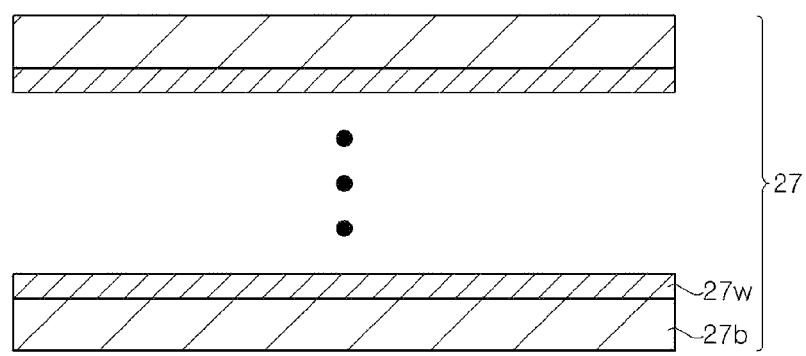
FIG. 3 is an enlarged sectional view of a superlattice layer in accordance with one embodiment of the present invention.

Referring to FIG. 1 to FIG. 3, a semiconductor device according to one embodiment of the present invention may include a substrate 21, a first conductivity-type gallium nitride-based semiconductor layer 23, a superlattice layer 25, an active layer 27, an electron blocking layer 29, and a second conductivity-type gallium nitride-based semiconductor layer 31.

The substrate 21 is used to grow gallium nitride-based semiconductor layers, and may be a sapphire substrate, a SiC substrate, a spinel substrate, a silicon substrate, a gallium nitride substrate, or the like, without being limited thereto. For example, the substrate 21 may be a patterned sapphire substrate (PSS) or a gallium nitride substrate.

With the substrate 21 loaded in a chamber of an MOCVD apparatus, source gases and an atmosphere gas (including a carrier gas) are supplied into the chamber to grow the gallium nitride-based semiconductor layers 23, 25, 27, 29, 31. These gallium nitride-based semiconductor layers 23, 25, 27, 29, 31 may be grown at lower chamber pressures than standard atmospheric pressure (760 Torr) using an MOCVD apparatus, such as low pressure MOCVD apparatuses.

The first conductivity-type gallium nitride-based semiconductor layer 23 may be grown on the substrate 21 at a first chamber pressure, for example, ranging from 100 Torr to 300 Torr. The first conductivity-type gallium nitride-based semiconductor layer 23 may be formed of a gallium nitride-based semiconductor layer doped with an n-type impurity, for example, Si. The first conductivity-type gallium nitride-based semiconductor layer 23 may include a GaN layer, and may be formed in a single layer or in multiple layers.

The first conductivity-type gallium nitride-based semiconductor layer 23 may be grown by supplying $N_2$ and/or $H_2$ carrier gases together with a metal source gas and $NH_3$ into the chamber. Trimethylgallium (TMG) or triethylgallium (TEG) may be used as the source gas of Ga. In addition, trimethylaluminum (TMA), trimethylindium (TMI), and the like may be used as the source gases of Al and In. $NH_3$ may be supplied as the source gas of N. The first conductivity-type semiconductor layer 23 may be grown at about 1050° C. to 1150° C.

When the substrate 21 is a heterogeneous substrate like a sapphire substrate, a low temperature buffer layer and a high temperature buffer layer (not shown) may be grown thereon before growth of the first conductivity-type semiconductor layer 23.

The superlattice layer 25 may be grown on the first conductivity-type gallium nitride-based semiconductor layer 23. As shown in FIG. 2, the superlattice layer 25 has a laminated structure in which a first gallium nitride layer 25a and a second gallium nitride layer 25b are alternately stacked one above another. For example, the first gallium nitride layer 25a may be formed of GaN or InGaN, and the second gallium nitride layer 25b may be formed of InGaN.

Figure 4:
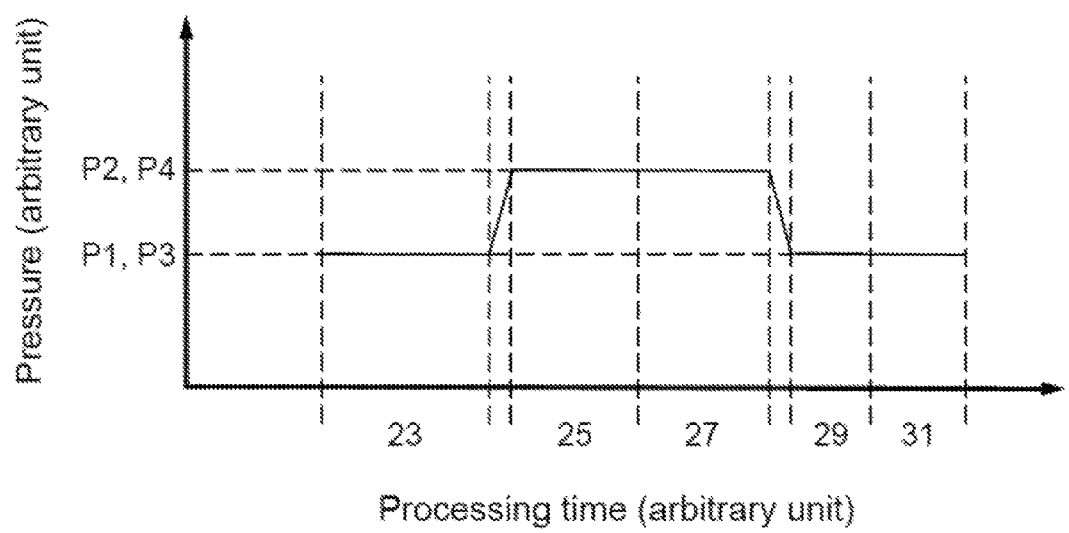
FIG. 4 is a graph schematically depicting chamber pressure versus processing time in fabrication of a semiconductor device.

As shown in FIG. 4, the superlattice layer 25 may be formed at a higher chamber pressure (referred to as a 'fourth chamber pressure P4' for convenience), for example, ranging from 300 Torr to 700 Torr, than the first chamber pressure P1. The fourth chamber pressure P4 may be increased by increasing the flux of $NH_3$ and $N_2$. As the superlattice layer is grown at a relatively high pressure, a difference in growth temperature between the first gallium nitride layer 25a and the second gallium nitride layer 25b may be set to 10° C. or less, and particularly, the superlattice layer can be grown without changing the growth temperature.

The superlattice layer 25 may be formed by alternately stacking the GaN layer 25a and the InGaN layer 25b such that each layer has a thickness of 20 Å. Although the GaN layer 25a is shown as the lowermost layer and the InGaN layer 25b is shown as the uppermost layer in the drawings, the lowermost layer of the superlattice layer 25 may be formed of GaN or InGaN and the uppermost layer may be formed of GaN. The uppermost layer of the superlattice layer 25 is doped with a high concentration of Si. That is, the doping concentration of Si in the uppermost layer may be about 4 or 5 times higher than the doping concentration of Si in the first conductivity-type gallium nitride-based semiconductor layer 23. Most layers in the superlattice layer 25 may be formed as undoped layers to reduce current leakage in the semiconductor device. In addition, as the uppermost layer of the superlattice layer 25 is doped in a high concentration, it is possible to improve junction characteristics between the superlattice layer 25 and the active layer 27.

As shown in FIG. 4, the active layer 27 may be grown on the superlattice layer 25 at a higher chamber pressure (second chamber pressure P2) than the first chamber pressure P1. For example, the second chamber pressure may range from 300 Torr to 700 Torr. When the superlattice layer 25 is omitted, the active layer 27 may be grown on the first conductivity-type gallium nitride-based semiconductor layer 23.

As shown in FIG. 3, the active layer 27 may have a multi-quantum well structure in which a plurality of barrier layers 27b and a plurality of well layers 27w are alternately stacked. The well layers 27w may be formed of In-containing gallium nitride, for example InGaN, and the barrier layers 27b may be formed of gallium nitride having a wider band gap than the well layers 27w, for example, GaN, InGaN, AlGaN, or AlInGaN. The content ratio of In in the InGaN quantum-well layer is determined according to desired light wavelengths.

Since the well layers 27w and the barrier layers 27b are grown at a relatively high second chamber pressure, the growth temperature of the well layers 27w can be increased, and thus a difference in growth temperature between the well layers 27w and the barrier layers 27b may be set to 10° C. or less. Since the well layers 27w and the barrier layers 27b are grown at the same or similar temperature, the well layers 27w do not decompose upon growth of the barrier layers 27b after growth of the well layers 27w. Thus, the interface characteristics between the well layers 27w and the barrier layers 27b may be improved without a separate cap layer.

The active layer 27 may adjoin the uppermost layer of the superlattice layer 25. In other words, the active layer 27 and the superlattice layer 25 may be successively grown. In this case, successive growth of the superlattice layer 25 and the active layer 27 may be achieved without substantial change of chamber pressure.

During growth of the active layer 27, an atmosphere gas (including a carrier gas) is supplied together with the source gases into the chamber. Here, $N_2$ is generally used as the atmosphere gas and the supply of $H_2$ is blocked. $H_2$ can deteriorate crystal quality of the active layer 27.

The electron blocking layer 29 may be grown on the active layer 27. The electron blocking layer 29 may be formed of, for example, AlGaN, and grown at a lower chamber pressure, for example, ranging from 100 Torr to 300 Torr, than the second chamber pressure. The electron blocking layer 29 may be grown at a higher temperature than the growth temperature of the active layer 27. In one exemplary embodiment, the electron blocking layer 29 may be grown at a temperature of about 1000° C. or more.

The second conductivity-type gallium nitride-based semiconductor layer 31 is grown on the electron blocking layer 29. The second conductivity-type gallium nitride-based semiconductor layer 31 may be grown at a lower chamber pressure (third chamber pressure P3, as shown in FIG. 4), for example, ranging from 100 Torr to 300 Torr, than the second chamber pressure P2. The second conductivity-type gallium nitride-based semiconductor layer 31 may have a single GaN layer or a multilayer structure including a GaN layer. The electron blocking layer 29 may be omitted and the second conductivity-type gallium nitride-based semiconductor layer 31 may be directly formed on the active layer 27.

Although FIG. 4 illustrates the first chamber pressure P1 and the third chamber pressure P3 as being approximately equal, this illustration is by no means limiting. One of ordinary skill in the art would know that the first chamber pressure P1 and the third chamber pressure P3 may be different. Similarly, although FIG. 4 illustrates the second chamber pressure P2 and the fourth chamber pressure P4 as being approximately equal, this illustration is by no means limiting. One of ordinary skill in the art would know that the second chamber pressure P2 and the fourth chamber pressure P4 may be different. FIG. 4 simply illustrates that the second chamber pressure P2 and the fourth chamber pressure P4 may be higher than the first chamber pressure P1 and the third chamber pressure P3.

A semiconductor device such as a light emitting diode or a laser diode may be fabricated using the semiconductor layers 23, 25, 27, 29, and 31 grown on the substrate 21.

The methods according to embodiments of the present invention employ a phenomenon in which the content of indium in the active layer increases with increasing chamber pressure at the same growth temperature. In the related art, in order to form a well layer having a desired content of indium, the well layer is grown at a low growth temperature at a relatively low pressure (about 200 Torr). On the contrary, according to the present invention, the chamber pressure is increased to a relatively high pressure, thereby allowing a higher growth temperature of the well layer than in the related art. Thus, methods according to exemplary embodiments of the present invention enable growth of an active layer including a well layer and a barrier layer substantially at the same temperature, whereby characteristics of an interface between the well layer and the barrier layer can be improved.

The light emitting device having well layers grown at a middle pressure according to an exemplary embodiment of the present invention has a photoluminescence intensity (PL intensity) and an optical power (Po) higher than a light emitting device having well layers grown at a low pressure according to a comparative example, as shown in Table 1 below. In Table 1, the low pressure is 200 Torr and the middle pressure is 450 Torr.

TABLE 1

| | PL intensity | Po |
|---|---|---|
| low pressure (comparative example) | 100% | 100% |
| middle pressure (exemplary embodiment) | 112% | 107% |

According to exemplary embodiments of the present invention, there is no need to change the growth temperatures of the well layer and the barrier layer, and even in the case of changing the growth temperatures thereof, it is possible to obtain desired effects through minute change of a difference between the growth temperatures. Thus, it is possible to reduce processing time by eliminating a ramp time for changing the growth temperature.

In addition, when growing a superlattice layer, the methods according to exemplary embodiments of the present invention employ a relatively high chamber pressure, thereby improving interface characteristics between respective layers while reducing growth time.

Furthermore, since methods according to exemplary embodiments of the present invention allow a first or second conductive type gallium nitride-based semiconductor layer to be grown at a relatively low pressure, it is possible to prevent increase in growth time, as compared with a relatively high chamber pressure for growing these semiconductor layers.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of growing gallium nitride-based semiconductor layers through metal-organic chemical vapor deposition, the method comprising:
   disposing a substrate in a chamber;
   growing a first conductivity-type gallium nitride-based semiconductor layer on the substrate at a first chamber pressure that is more than 100 Torr and less than or equal to 300 Torr;
   growing a superlattice layer directly on the first conductivity-type gallium nitride-based semiconductor layer, and growing the superlattice layer comprises:
     forming a indium gallium nitride layer at a fourth chamber pressure that is higher than the first chamber pressure and at a first superlattice growth temperature; and
     forming a gallium nitride layer at the fourth chamber pressure and at a second superlattice growth temperature that is within 10° C. of the first superlattice growth temperature;
   growing a gallium nitride-based active layer on the first conductivity-type gallium nitride-based semiconductor layer at a second chamber pressure that is higher than the first chamber pressure, and growing the gallium nitride-based active layer comprises:
     growing barrier layers at the second chamber pressure and at a first active layer growth temperature; and
     growing well layers at the second chamber pressure and at a second active layer growth temperature that is within 10° C. of the first active layer growth temperature; and
   growing a second conductivity-type gallium nitride-based semiconductor layer on the active layer at a third chamber pressure that is lower than the second chamber pressure,
   wherein the second and third chamber pressures are lower than 760 Torr.

2. The method of claim 1, wherein the second chamber pressure is in the range of 300 Torr to 700 Torr.

3. The method of claim 2, wherein the third chamber pressure is in the range of 100 Torr to 300 Torr.

4. The method of claim 1, wherein the well layers comprise In-containing gallium nitride layers, and the barrier layers comprise gallium nitride layers having a wider band gap than the well layers.

5. The method of claim 4, wherein the well layers and the barrier layers are grown at a lower temperature than the first and second conductivity-type gallium nitride-based semiconductor layers.

6. The method of claim 1, wherein the first superlattice growth temperature and the second superlattice growth temperature are about the same.

7. The method of claim 1, wherein the first active layer growth temperature and the second active layer growth temperature are about same.

8. The method of claim 1, wherein growing the active layer comprises supplying an $N_2$ atmosphere gas, together with source gases of In, Ga, and N, into the chamber while the active layer is grown, and blocking the supply of $H_2$ gas.

9. The method of claim 1, further comprising growing a gallium nitride-based electron blocking layer at a chamber pressure in the range of 100 Torr to 300 Torr before growing the second conductivity-type semiconductor layer.

10. The method of claim 8, wherein a silicon (Si) doping concentration of an uppermost layer of the superlattice layer that is closest to the gallium nitride-based active layer is at least four times higher than a silicon (Si) doping concentration of the first conductivity-type gallium nitride-based semiconductor layer.

* * * * *